(12) United States Patent  
Wang et al.

(10) Patent No.: US 7,728,679 B2
(45) Date of Patent: Jun. 1, 2010

(54) CALIBRATION OF VOLTAGE CONTROLLED OSCILLATORS

(75) Inventors: Stanley Wang, Cupertino, CA (US); Bendik Kleveland, Santa Clara, CA (US); Thomas H. Lee, Burlingame, CA (US)

(73) Assignee: Microchip Technology, Inc., Chandler, AZ (US)

( * ) Notice: Subject to any disclaimer, the term of this patent is extended or adjusted under 35 U.S.C. 154(b) by 132 days.

(21) Appl. No.: 12/171,277

(22) Filed: Jul. 10, 2008

(65) Prior Publication Data

US 2008/0278247 A1  Nov. 13, 2008

Related U.S. Application Data

(62) Division of application No. 11/801,185, filed on May 8, 2007, now Pat. No. 7,415,369.

(51) Int. Cl.
*H03L 1/00* (2006.01)
(52) U.S. Cl. .................. 331/44; 331/182; 331/176
(58) Field of Classification Search ................ 331/44, 331/182, 176, 117 R; 702/64
See application file for complete search history.

(56) References Cited

U.S. PATENT DOCUMENTS 5,175,884 A  12/1992  Suarez

| 5,907,263 A | 5/1999 | Divine et al. |
| 7,525,392 B2 * | 4/2009 | Tarng .................. 331/18 |
| 2005/0030108 A1 | 2/2005 | Duncan et al. |
| 2009/0146752 A1 * | 6/2009 | O'Day et al. ............ 331/176 |

OTHER PUBLICATIONS

Hitko et al., "Adaptive Biasing of a 5.8Ghz CMOS Oscillator," ISSCC 2002 Session 17/Advanced RF Techniques/17.4, MIT Microsystems Technology Laboratories, Cambridge, MA, pp. 230-231, ISSCC 2002 Visuals Supplement.
Hitko et al., "Adaptive Biasing of a 5.8Ghz CMOS Oscillator," ISSCC 2002 Session 17/Advanced RF Techniques/17.4, MIT Microsystems Technology Laboratories, Cambridge, MA, pp. 3 pages total, ISSCC 2002 Visuals Supplement.
Rogers et al., "A Study of Digital and Analog Automatic-Amplitude Control Circuitry for voltage-Controlled Oscillators," IEEE Journal of Solid-State circuits, vol. 38, No. 2, Feb. 2003, pp. 352-356.
Margarit et al., "A Low-Noise, Low-Power VCO With Automatic Amplitude Control for Wireless Applications," IEEE Journal of Solid-State Circuits, vol. 34, No. 6, Jun. 1999, pp. 761-771.

(Continued)

*Primary Examiner*—Joseph Chang
(74) *Attorney, Agent, or Firm*—The Mueller Law Office, P.C.

(57) ABSTRACT

A calibration circuit (20, 50) and method (60) for calibrating the bias current of a VCO (10, 40) to minimize phase noise. The calibration circuit (20, 50) monitors the average voltage at the common-mode node of the VCO (10, 40) while varying the bias current over a predetermined range. The calibration circuit (20, 50) identifies the bias current associated with the minimum average common-mode voltage and utilizes this bias current for calibrating the biasing transistor of the VCO (10, 40).

7 Claims, 6 Drawing Sheets

OTHER PUBLICATIONS

Zanchi et al., "A 2-V 2.5-GHz-104dBc/Hz at 100kHz Fully Integrated VCO with wide Bade Low-Noise Automatic Amplitude Control Loop," IEEE Journal of Solid-State Circuits, vol. 35, No. 4 Apr. 2001, pp. 611-619.

Berny et al., "A 1.8-GHz LC VCO With 1.3GHz Tuning Range and Digital Amplitude Calibration," IEEE Journal of Solid-State Circuits, vol. 40, No. 4, Apr. 2005, pp. 909-917.

* cited by examiner

CALIBRATION OF VOLTAGE CONTROLLED OSCILLATORS

CROSS-REFERENCE TO RELATED APPLICATIONS

This application is a divisional of U.S. patent application Ser. No. 11/801,185 filed May 8, 2007 and is incorporated by reference in its entirety.

FIELD OF THE INVENTION

The invention relates generally to the calibration of voltage-controlled oscillators (VCOs), and more specifically to the calibration of VCOs to minimize phase noise.

BACKGROUND OF THE INVENTION

VCOs are important circuit elements for a wide range of applications, including function generators, phase-locked loops and frequency synthesizers. VCOs produce an oscillating output with a frequency that is controlled by an applied DC voltage. One of the challenges associated with VCOs is phase noise. It is well known that bias transistors are a significant contributor of $1/f^3$ phase noise for complimentary metal-oxide semiconductor (CMOS) VCOs. It is also known that an optimum bias current exists for each VCO to minimize the $1/f^3$ phase noise. However, due to variations in the operating frequency, voltage, temperature and processing of a VCO, it is quite difficult to identify this optimum bias current.

Prior art attempts to identify the optimum bias current for calibrating a VCO to minimize phase noise have focused on the use of peak-detection circuits and control loops. This approach has several disadvantages. First, the addition of a peak-detection circuit and a control loop add significant cost and overhead to a VCO. In addition, peak-detection circuits introduce additional capacitance and lower the tuning range of a VCO.

SUMMARY OF THE INVENTION

In one aspect of the invention, a voltage-controlled oscillator is provided. The voltage-controlled oscillator includes (a) means for altering a bias current of the voltage-controlled oscillator and for monitoring an average voltage at a common-mode node of the voltage-controlled oscillator; (b) means for identifying an optimum bias current corresponding to an extreme value of the average voltage; and (c) means for calibrating the voltage-controlled oscillator using the optimum bias current to minimize $1/f^3$ phase noise.

In another aspect of the invention, an information-processing system is provided. The information processing system includes a voltage-controlled oscillator. The voltage-controlled oscillator includes a calibration circuit for altering a bias current of the voltage-controlled oscillator and for monitoring an average voltage at a common-mode node of the voltage-controlled oscillator. The calibration circuit identifies an optimum bias current corresponding to an extreme value of the average voltage and calibrates the voltage-controlled oscillator using the optimum bias current to minimize $1/f^3$ phase noise.

In another aspect of the invention, a method is provided for calibrating a bias current of a voltage-controlled oscillator to minimize $1/f^3$ phase noise. The method comprises the steps of (a) setting the bias current to a first predetermined value; (b) sampling an average value, corresponding to the bias current, of a common-mode voltage of the voltage-controlled oscillator; (c) varying the bias current by a predetermined amount towards a second predetermined value; (d) repeating the sampling and varying until an optimum bias current corresponding to an extreme value of said average value of the common-mode voltage is identified; and (e) calibrating the voltage-controlled oscillator using the optimum bias current.

DETAILED DESCRIPTION OF THE INVENTION

Figure 1:
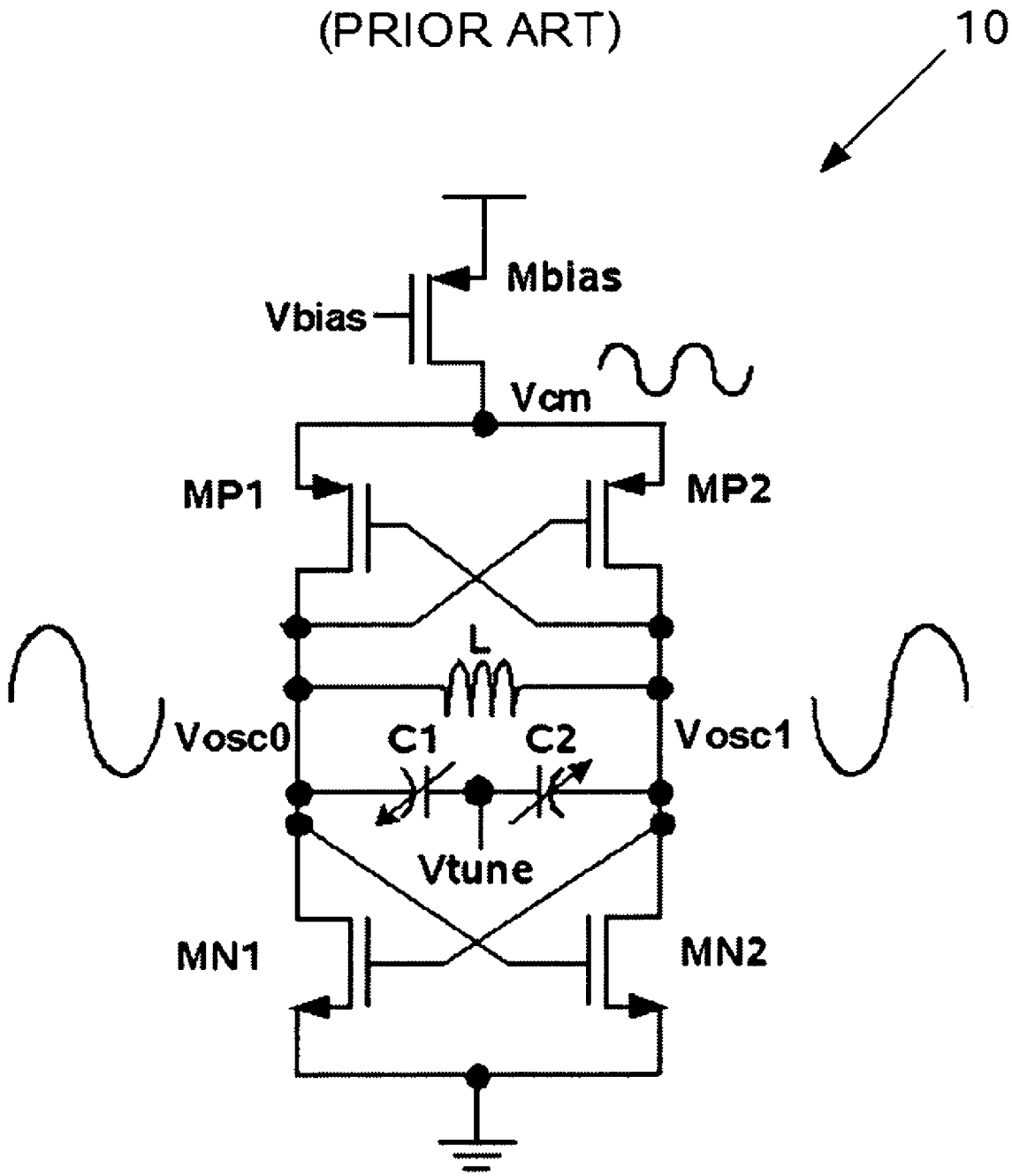
FIG. 1 illustrates a prior art CMOS LC VCO that is suitable for use with the present invention.
Figure 4:
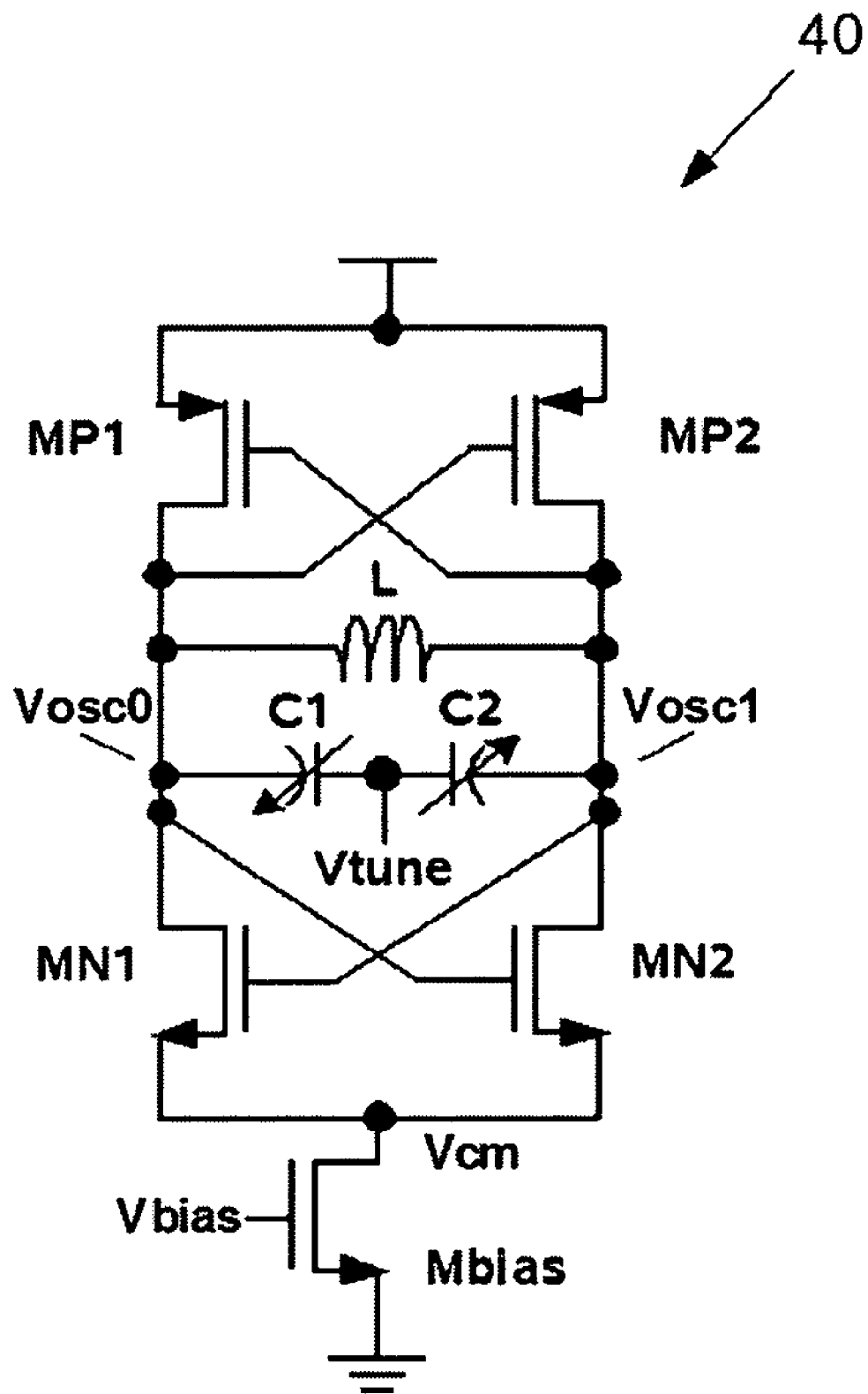
FIG. 4 illustrates a second example of a prior art CMOS LC VCO that is suitable for use with the present invention.

The performance of prior art VCOs, such as the VCOs illustrated in FIGS. 1 and 4, is degraded by phase noise, which is partially caused by the biasing transistor of the VCOs. For each VCO there exists an optimum bias current for minimizing the close-in phase noise. Methods and systems consistent with the present invention utilize a correlation between the average voltage at the common-mode node of a VCO and the 1/f noise contribution of the biasing transistor to quickly and accurately calibrate the bias current of a VCO to minimize $1/f^3$ phase noise.

Reference now will be made in detail to embodiments of the disclosed invention, one or more examples of which are illustrated in the accompanying drawings. Each example is provided by way of explanation of the present technology, not limitation of the present technology. In fact, it will be apparent to those skilled in the art that modifications and variations can be made in the present technology without departing from the spirit and scope thereof. For instance, features illustrated or described as part of one embodiment may be used on another embodiment to yield a still further embodiment. Thus, it is intended that the present subject matter covers such modifications and variations as come within the scope of the appended claims and their equivalents.

FIG. 1 illustrates an example of a prior art VCO 10 that is suitable for use with methods and systems of the present invention. The VCO 10 illustrated in FIG. 1 is a differential CMOS inductor-capacitor (LC) VCO. The VCO 10 generates differential outputs ($V_{osc0}$ and $V_{osc1}$), which are 180 degrees out of phase. The frequency of $V_{osc0}$ and $V_{osc1}$ is determined by an applied voltage ($V_{tune}$) and by the values of an inductor (L) and two varacters (C1 and C2), along with parasitic capacitance. The VCO 10 is biased by a biasing transistor ($M_{bias}$). The amount of bias current ($I_{bias}$) that passes through the biasing transistor is determined by the size of the transistor and a biasing voltage ($V_{bias}$). The VCO 10 also includes two sets of cross-coupled switching transistors (MP1, MP2 and MN1, MN2).

Figure 2:
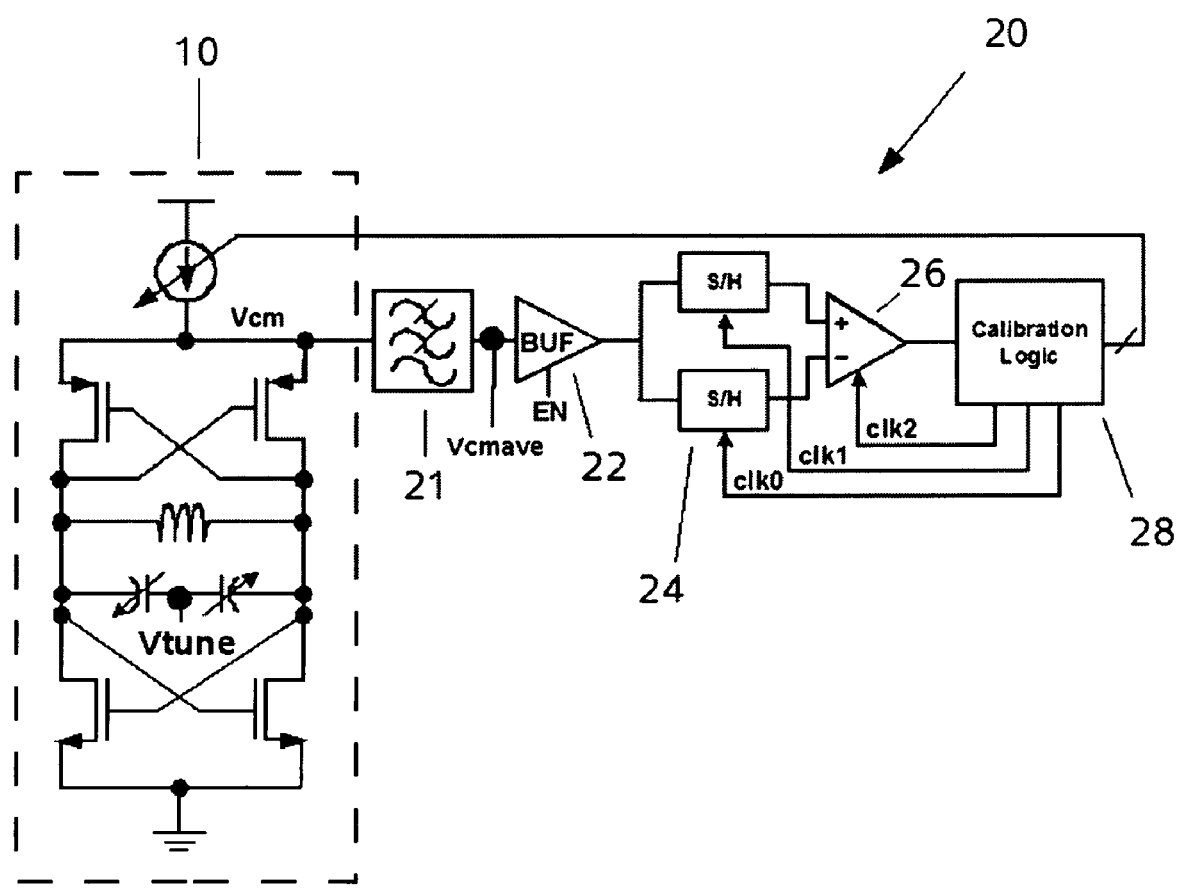
FIG. 2 illustrates an exemplary embodiment of a calibration circuit for calibrating the VCO of FIG. 1 to minimize phase noise.

FIG. 2 illustrates the VCO 10 of FIG. 1 in combination with an exemplary embodiment of a calibration circuit 20 that is consistent with the present invention. The calibration circuit 20 includes hardware and/or software for altering the $I_{bias}$ of the VCO 10 and for sampling the associated average voltages at the common-mode node of the VCO. The calibration circuit also includes hardware and/or software for determining the minimum or maximum of the average voltages in order to identify the optimum bias current.

In the embodiment illustrated in FIG. 2, the input of the calibration circuit 20 is connected to the common-mode node of the VCO 10. The output of the calibration circuit 20 is connected to modify $I_{bias}$ of the VCO 10. The calibration circuit 20 steps the VCO 10 through a range of bias currents by supplying the VCO 10 with a range of $I_{bias}$ values. For each bias current, the calibration circuit 20 determines the corresponding DC value ($V_{cmave}$) of the voltage at the common-mode node ($V_{cm}$) of the VCO. The calibration circuit 20 may include a filter 21 to generate $V_{cmave}$ from the common-mode voltage. The output of the filter 21 may also be connected to a buffer circuit 22 for temporarily buffering the value of $V_{cmave}$ and providing isolation between the VCO and the calibration circuits. The buffer circuit 22 may be enabled, for example, by an enabling signal (EN). The output of the buffer circuit 22 is connected to two or more sample-and-hold circuits 24 for sampling and holding a series of $V_{cmave}$ values. The output of the sample-and-hold circuits 24 are connected to a comparator 26, which compares the levels of sample values of $V_{cmave}$. The output of the comparator 26 is connected to a calibration-logic circuit 28. The calibration-logic circuit 28 generates clock signals (clk0, clk1 and clk2) to control the sample-and-hold circuits 24 and the comparator 26. The calibration-logic circuit 28 causes the calibration circuit 20 to step the VCO 10 through a range of bias currents while determining the $V_{cmave}$ corresponding to each bias current. The calibration-logic circuit 28 then determines the optimum bias current for the VCO 10 by identifying the bias current that corresponds to the minimum value of $V_{cmave}$. As an alternative to stepping through an entire range of bias currents, the calibration-logic circuit 28 may identify the minimum value of $V_{cmave}$ by identifying the value at which the slope of $V_{cmave}$ as a function of $I_{bias}$ reverses (see FIG. 3).

Figure 3:
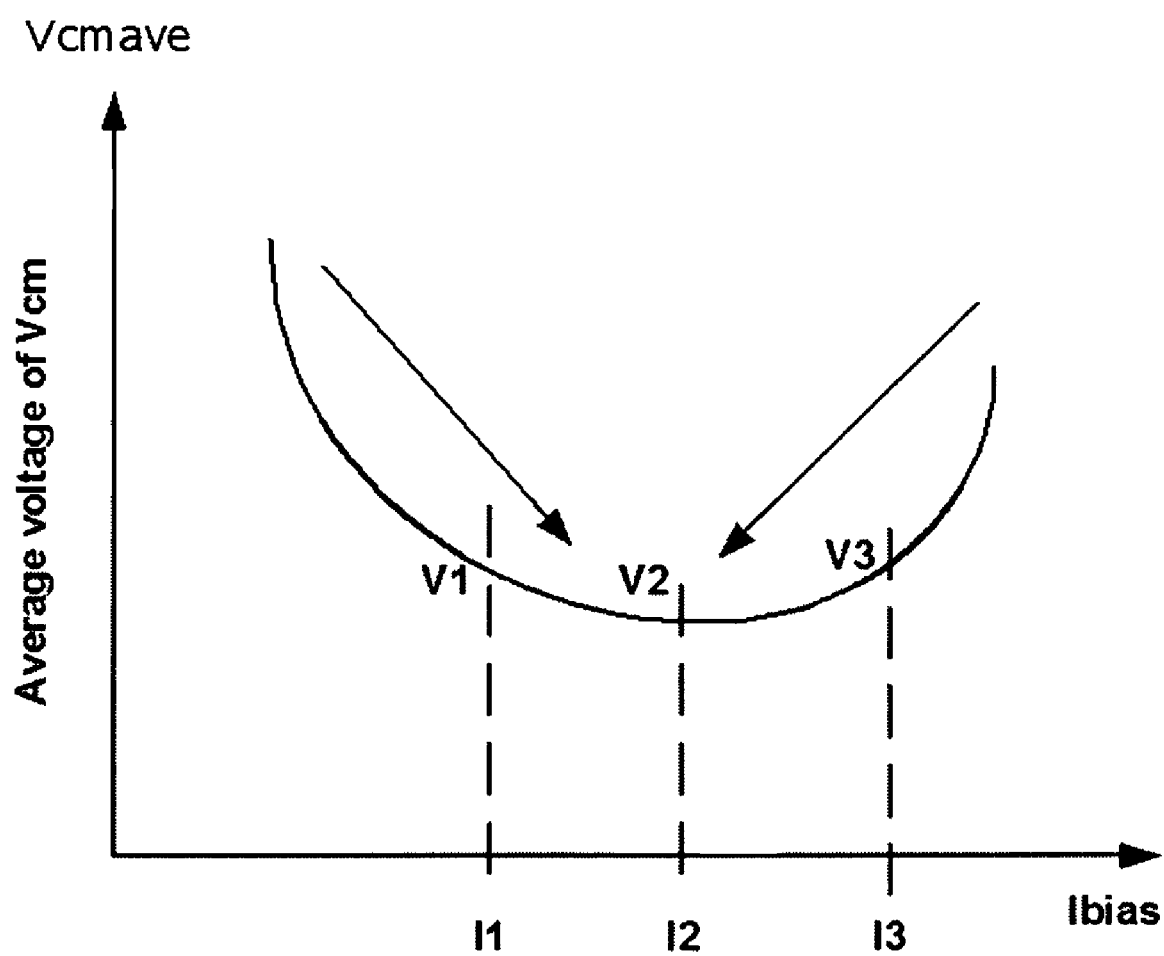
FIG. 3 is a graph that illustrates an exemplary relationship between the bias current and the average voltage at the common-mode node of a VCO.

FIG. 3 illustrates an exemplary relationship between $I_{bias}$ and $V_{cmave}$ for a VCO that is consistent with the present invention. The curve in FIG. 3 represents $V_{cmave}$ as a function of $I_{bias}$. The point V1 on the curve corresponds to a value of $V_{cmave}$ at an $I_{bias}$ value of I1. As illustrated by the points V1, V2 and V3, there exists a particular value of $I_{bias}$ that corresponds to a minimum value of $V_{cmave}$. So, for example, when $I_{bias}$ is increased from I1 to I2, $V_{cmave}$ decreases from V1 to V2. When $I_{bias}$ is further increased from I2 to I3, $V_{cmave}$ increases from V2 to V3. By varying $I_{bias}$ over a predetermined range, it is thus possible for the calibration circuit illustrated in FIG. 2 to identify the minimum value of $V_{cmave}$.

The inventor of the present invention has determined that the minimum up-conversion of the 1/f device noise from the bias transistor occurs when the switching transistors MN1, MN2, MP1 and MP2 of the VCO are operating at the boundary of their saturation and triode regions. At this boundary, the amplitude of the VCO output is sufficiently large to be symmetrical. Any further increase of amplitude pushes the switching transistors into the triode regions where the up-conversion of the 1/f device noise increases, which leads to a large $1/f^3$ phase noise. The boundary of the saturation and triode regions corresponds to the minimum of the average voltage at the common-mode node of the VCO. In other words, a correlation exists between the minimum or maximum value of $V_{cmave}$ and the optimum bias current for minimizing $1/f^3$ phase noise.

FIG. 4 illustrates a second example of a VCO 40 that is suitable for use with the present invention. This VCO 40 is a CMOS LC VCO with an NMOS biasing transistor. As with the previously described VCO, this VCO 40 generates differential outputs ($V_{osc0}$ and $V_{osc1}$), which are 180 degrees out of phase. The oscillating frequency of the outputs is determined by the applied voltage ($V_{tune}$) and by the values of the inductor (L) and the varacters (C1 and C2), along with parasitic capacitance. The VCO 40 is biased by a biasing transistor ($M_{bias}$). The amount of bias current that passes through the biasing transistor is determined by the size of the transistor and bias voltage ($V_{bias}$). The VCO 40 includes two sets of cross-coupled transistors (MP1, MP2 and MN1, MN2). For this VCO 40, the optimum bias current corresponds to the maximum value of the average voltage at the common-mode node ($V_{cmave}$). Identifying the maximum value of $V_{cmave}$ enables the VCO to be calibrated to minimize phase noise.

The VCOs described above with reference to FIGS. 1 and 4 are only two examples of VCO configurations that are suitable for use with the present invention. One of skill in the art will appreciate that various additional VCO configurations are suitable for use with methods and systems of the present invention, including VCOs with different arrangements of inductors, capacitors and varactors and VCOs with different types of transistors, such as NMOS and PMOS transistors.

Figure 5:
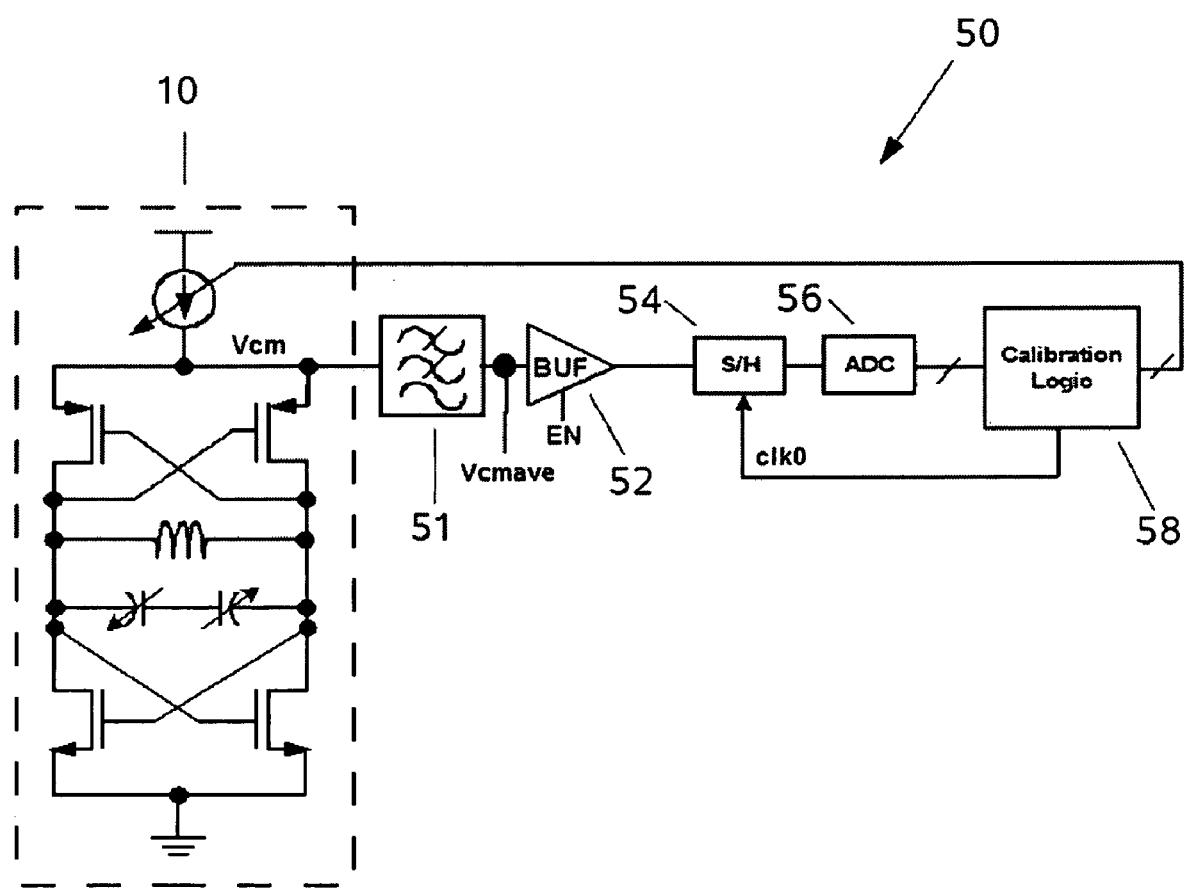
FIG. 5 illustrates a second exemplary embodiment of a calibration circuit for calibrating the VCO of FIG. 1 to minimize $1/f^3$ phase noise.

FIG. 5 illustrates a second embodiment of a calibration circuit 50 that is consistent with the present invention. The calibration circuit 50 is connected to a VCO 10, which was previously illustrated in FIG. 1. The input of the calibration circuit 50 is connected to the common-mode node of the VCO 10. The output of the calibration circuit 50 is connected to the $V_{bias}$ node of the VCO 10. The calibration circuit 50 steps the VCO 10 through a range of bias currents by supplying the VCO 10 with a range of $V_{bias}$ values. For each amplitude of the bias current, the calibration circuit 50 determines the corresponding value of $V_{cmave}$.

The calibration circuit 50 may include a filter 51 for generating $V_{cmave}$ from the common-mode voltage ($V_{cm}$). The output of the filter 51 may be connected to a buffer circuit 52 for temporarily buffering the value of $V_{cmave}$. The buffer circuit 52 may be enabled, for example, by an enabling signal (EN). The output of the buffer circuit 52 is connected to a sample-and-hold circuit 54 for sampling and holding values of $V_{cmave}$. The output of the sample-and-hold circuit 54 is connected to an analog-to-digital converter 56, which converts the analog samples of $V_{cmave}$ into digital signals. The output of the analog-to-digital converter 56 is connected to a calibration-logic circuit 58. The calibration-logic circuit 58 generates a clock signal (clk0) for controlling the sample-and-hold circuit 54. The calibration-logic circuit 58 causes the calibration circuit 50 to vary the VCO 10 through a range of bias currents and determines the corresponding $V_{cmave}$. The calibration-logic circuit 58 identifies the bias current that corresponds to the minimum $V_{cmave}$ so that it may be used to calibrate the VCO 10.

Figure 6:
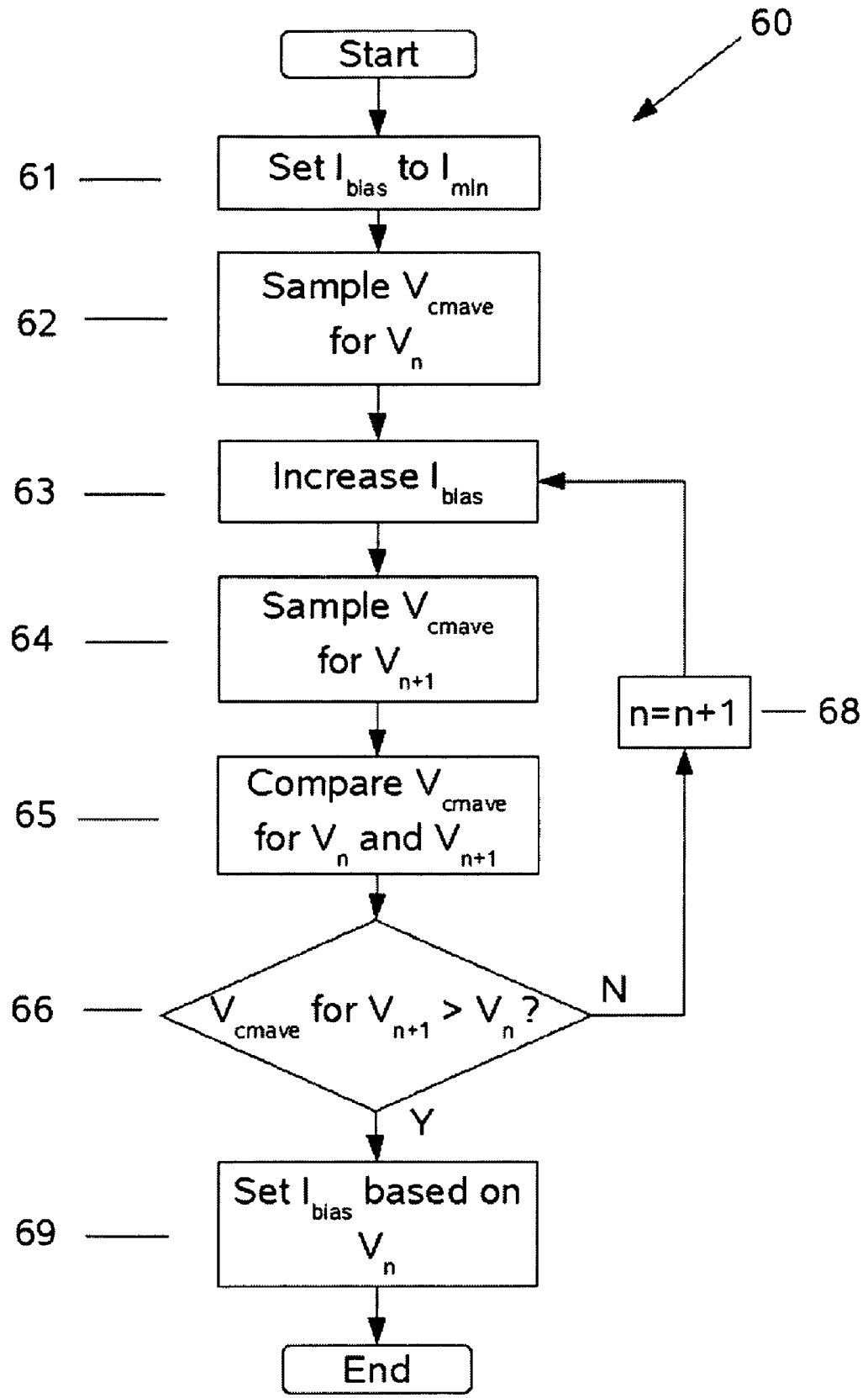
FIG. 6 is a flowchart that illustrates exemplary steps for a method that is consistent with the present invention.

FIG. 6 is a flowchart illustrating steps associated with an exemplary method 60 that is consistent with the present invention. In step 61, $I_{bias}$ is set to a first predetermined level. This predetermined level may be, for example, the maximum or minimum bias current associated with the VCO being calibrated. In step 62, a first voltage level ($V_n$) at the common-node of the VCO and its corresponding DC value ($V_{cmave}$) are sampled for the first $I_{bias}$. In step 63, $I_{bias}$ is varied by a predetermined amount, for example by increasing $I_{bias}$ step-wise, toward a second predetermined level. The amount by which $I_{bias}$ is varied and the range over which $I_{bias}$ is varied may be changed depending on the desired speed and accuracy of the calibration. The first predetermined level may be, for example, the minimum $I_{bias}$ for the VCO and the second predetermined level may be, for example, the maximum $I_{bias}$ for the VCO. In this way, the full range of $I_{bias}$ amplitudes associated with the VCO may be evaluated by the calibration circuit.

In step 64, a second voltage level ($V_{n+1}$) at the common-node of the VCO and its corresponding DC value ($V_{cmave}$) are sampled for the new $I_{bias}$. In step 65, the value of $V_{cmave}$ for the first and second voltage levels ($V_n$ and $V_{n+1}$) are compared. In step 66, if $V_{cmave}$ for $V_{n+1}$ is greater than $V_{cmave}$ for $V_n$, the process proceeds to step 69 in which the $I_{bias}$ for the VCO is calibrated using the value corresponding to $V_n$. If $V_{cmave}$ for $V_{n+1}$ is not greater than $V_{cmave}$ for $V_n$, the process proceeds to step 68. In step 68, value of n is increased by one and the process returns to step 63.

Although embodiments of the invention have been discussed primarily with respect to specific embodiments thereof, other variations are possible. Various VCO configurations may be used in place of, or in addition to, the VCO configurations presented herein. Steps may be performed by hardware or software, as desired. Note that steps can also be added to, taken from or modified from the steps in this specification without deviating from the scope of the invention. In general, any flowcharts presented are only intended to indicate one possible sequence of basic operations to achieve a function, and many variations are possible. Those of skill in the art will also appreciate that methods and systems consistent with the present invention are suitable for use in a wide range of applications, such as radio-frequency identification (RFID) and other information-processing systems and GSM, GPRS and WCDMA and other communications systems.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention.

The invention claimed is:

1. A voltage-controlled oscillator, comprising:
   means for altering a bias current of said voltage-controlled oscillator and for monitoring an average voltage at a common-mode node of said voltage-controlled oscillator;
   means for identifying an optimum bias current corresponding to an extreme value of said average voltage; and
   means for calibrating said voltage-controlled oscillator using said optimum bias current to minimize $1/f^3$ phase noise.

2. The voltage-controlled oscillator of claim 1 wherein said means for altering said bias current comprises a calibration-logic circuit.

3. The voltage-controlled oscillator of claim 1 wherein said extreme value is substantially equal to a minimum value of said average voltage at said common-mode node of said voltage-controlled oscillator.

4. The voltage-controlled oscillator of claim 1 wherein said extreme value is substantially equal to a maximum value of said average voltage at said common-mode node of said voltage-controlled oscillator.

5. The voltage-controlled oscillator of claim 2 wherein said means for identifying an optimum bias current comprises first and second sample-and-hold circuits for sampling values of said average voltage and a comparator for comparing values of said average voltage.

6. The voltage-controlled oscillator of claim 1 wherein said means for identifying an optimum bias current comprises a sample-and-hold circuit for sampling values of said average voltage and an analog-to-digital converter for converting said values from analog to digital signals.

7. The voltage-controlled oscillator of claim 6 further comprising a filter for filtering said average voltage and a buffer for temporarily buffering said average voltage.

* * * * *